(12) United States Patent
Kim

(10) Patent No.: US 7,691,706 B2
(45) Date of Patent: Apr. 6, 2010

(54) METHOD OF FABRICATING A SEMICONDUCTOR DEVICE

(75) Inventor: Bong Jun Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 480 days.

(21) Appl. No.: 11/616,820

(22) Filed: Dec. 27, 2006

(65) Prior Publication Data

US 2007/0148906 A1 Jun. 28, 2007

(30) Foreign Application Priority Data

Dec. 28, 2005 (KR) ............ 10-2005-0131520

(51) Int. Cl.
*H01L 21/336* (2006.01)

(52) U.S. Cl. ............ 438/258; 438/257; 438/593; 438/211

(58) Field of Classification Search ......... 438/257–258, 438/201, 211, 593–594, 424–453
See application file for complete search history.

(56) References Cited

U.S. PATENT DOCUMENTS 7,189,662 B2 *   3/2007   Parekh et al. ............ 438/778
2004/0018687 A1 *   1/2004   Hsieh et al. ............ 438/266

* cited by examiner

*Primary Examiner*—Dung A Le
(74) *Attorney, Agent, or Firm*—Sherr & Vaughn, PLLC

(57) ABSTRACT

Embodiments relate to a method for fabricating a semiconductor device. In embodiments, the method may include forming a gate dielectric layer on an active region of a semiconductor substrate defined by an isolation region to form a gate conductive layer pattern, etching the isolation region of the semiconductor substrate where the gate conductive layer pattern is formed, to form an isolation trench, forming a polyoxide layer on the gate conductive layer pattern and a sidewall oxide layer in the trench by carrying out an oxidation process, forming a spacer nitride layer on the polyoxide layer and a liner nitride layer on the sidewall oxide layer by carrying out a nitride layer forming process, and then forming a dielectric layer on an entire surface of the resultant structure to fill the trench.

13 Claims, 3 Drawing Sheets

METHOD OF FABRICATING A SEMICONDUCTOR DEVICE

The present application claims priority under 35 U.S.C. 119 and 35 U.S.C. 365 to Korean Patent Application No. 10-2005-0131520 (filed on Dec. 28, 2005), which is hereby incorporated by reference in its entirety.

BACKGROUND

As semiconductor devices become more highly integrated, an isolation distance between devices may become shortened. Accordingly, certain micro-sized devices may not be properly isolated through typical isolation schemes such as a local oxidation of silicon (LOCOS) scheme. To isolate certain micro-sized devices, a trench isolation process may be used. In the trench isolation process, a trench may be formed on a semiconductor substrate, and an insulating material such as a silicon oxide material may be filled in the trench, which may provide device isolation.

In a related art method for manufacturing a semiconductor device having a trench isolation layer, a hard mask layer pattern may be formed on a semiconductor substrate such as a silicon substrate. This may expose a surface of the semiconductor substrate, which may have an isolation layer defining an active area.

The exposed semiconductor substrate may be etched to a prescribed depth, for example by performing an etching process using the mask layer pattern as an etching mask. This may form an isolation trench.

To repair an inner wall of the trench that may have been damaged through the etching process to form the trench, a sidewall oxide layer may be formed on the inner sidewall of the trench. A liner nitride layer may be formed on the resultant structure.

An insulating layer may be deposited on the resultant structure, thereby filling the trench. A planarization process may then be performed, for example using a chemical mechanical polishing (CMP) process to expose a pad nitride pattern. A remaining pad nitride layer pattern may then be removed, which may form the trench isolation layer.

If the trench isolation layer is formed, a gate dielectric layer and a gate conductive layer may be formed in the active region, and a source/drain region may be formed, for example by carrying out a related art ion implantation process.

Such a related art fabricating method of the semiconductor including the trench isolation layer may have a problem. For example, a void may be formed when the trench is filled with the insulating layer. Further, it may take considerable time and require a complex process because of the thermal process used to form the trench isolation layer. Moreover, a residue of a polysilicon layer forming a gate electrode layer may occur since the gate electrode layer may be formed after forming the trench isolation layer.

SUMMARY

Embodiments relate to a method of fabricating a semiconductor device. Embodiments relate to a method of fabricating a semiconductor device having a trench isolation layer.

Embodiments relate to a method of fabricating a semiconductor device having a trench isolation layer that may be capable of reducing process time by simplifying the process without creating polysilicon residues.

In embodiments, a method for fabricating a semiconductor device may include interposing a gate dielectric layer on an active region of a semiconductor substrate defined by an isolation region to form a gate conductive layer pattern, etching the isolation region of the semiconductor substrate where the gate conductive layer pattern may be formed, to form an isolation trench, forming a polyoxide layer on the gate conductive layer pattern and a sidewall oxide layer in the trench by carrying out an oxidation process, forming a spacer nitride layer on the polyoxide layer and a liner nitride layer on the sidewall oxide layer by carrying out a nitride layer forming process, and forming a dielectric layer on an entire surface of the resultant structure to fill the trench.

In embodiments, forming the gate conductive layer pattern may include sequentially depositing a gate dielectric layer and a gate conductive layer on the semiconductor substrate, forming a photoresist layer pattern on the gate conductive layer, removing an exposed portion of the gate conductive layer by an etching process using the photoresist layer pattern as an etching mask, thereby forming the gate conductive layer pattern, and removing the photoresist layer pattern.

In embodiments, forming the isolation trench may include forming a photoresist layer pattern for exposing a gate dielectric layer of the isolation region on the semiconductor substrate where the gate conductive layer pattern may be formed, etching the exposed portion of the gate dielectric layer and an exposed portion of the semiconductor substrate by an etching process using the photoresist layer pattern as an etching mask, thereby forming the isolation trench, and removing the photoresist layer pattern.

In embodiments, the gate conductive layer pattern may include a polysilicon layer.

DETAILED DESCRIPTION OF EMBODIMENTS

Figure 1:
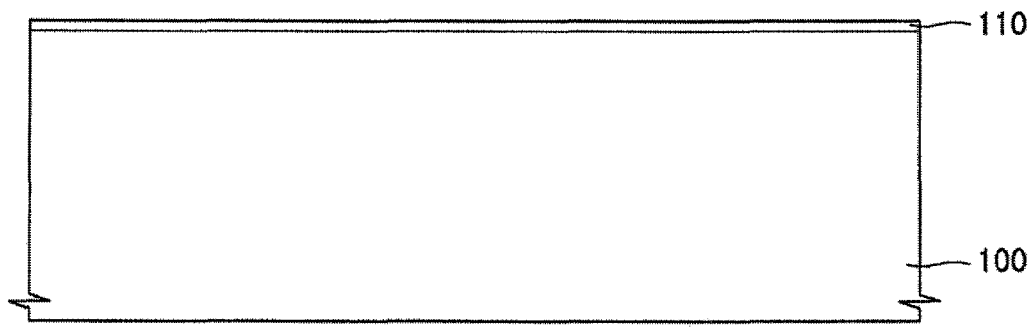
FIGS. 1 to 6 are example cross-sectional views illustrating a semiconductor device and a method of fabricating a semiconductor device having a trench isolation layer according to embodiments.

Referring to FIG. 1, pad oxide layer 110 may be formed on semiconductor substrate 100 such as a silicon substrate. Semiconductor substrate 100 may have an active region where components may be formed, and an isolation region for isolating components. Pad oxide layer 110 may be formed through an oxidation process. After forming pad oxide layer 110, and ion implanting process to control a channel threshold voltage Vt and form a well region may be carried out.

Figure 2:
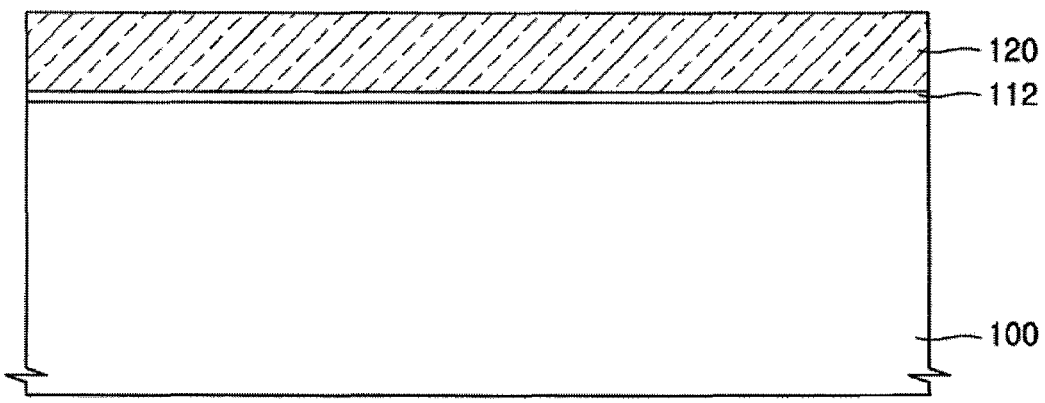

Referring to FIG. 2, pad oxide layer 110 may be removed. Oxide layer 112, which may be a gate dielectric layer, may be formed on semiconductor substrate 100. Polysilicon layer 120, which may be a gate conductive layer, may be formed on oxide layer 112.

Figure 3:
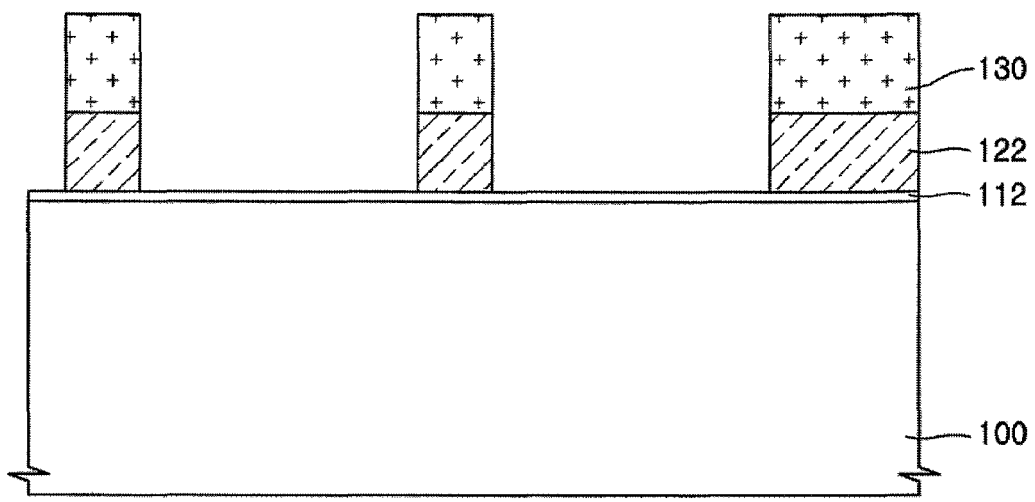

Referring to FIG. 3, photoresist layer pattern 130, which may be a mask layer pattern, may be formed on polysilicon layer 120 (shown in FIG. 2). Photoresist layer pattern 130 may have openings that may expose a partial surface of polysilicon layer 120. An etching process using photoresist layer pattern 130 as an etching mask may then be carried out with respect to the exposed part of polysilicon layer 120. Accordingly, polysilicon layer pattern 122 may be formed. Polysilicon layer pattern 122 may be a gate conductive layer pattern.

Figure 4:
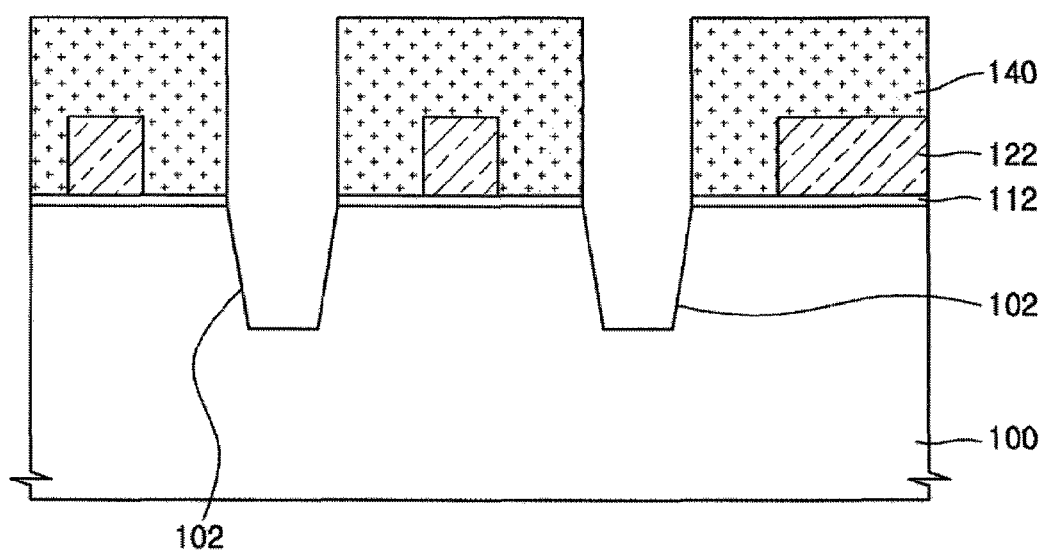

Referring to FIG. 4, photoresist layer pattern 130 (shown in FIG. 3), which may be used to form polysilicon layer pattern 122, may be removed. Photoresist layer pattern 140 may be formed on gate dielectric layer 112 and polysilicon layer pattern 122. Photoresist layer pattern 140 may have openings, by which a surface of gate dielectric layer 112 on the isolation region, may be is exposed. Exposed portions of gate dielectric layer 112 and semiconductor substrate 100 may be sequentially etched, for example using photoresist layer pattern 140 as a mask. Trenches 102, which may isolate components, may be formed.

Figure 5:
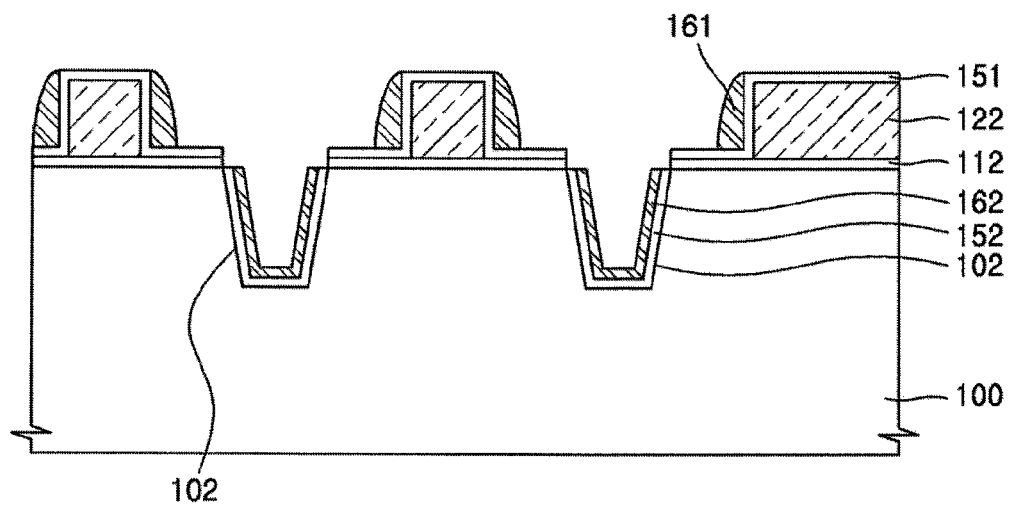

Referring to FIG. 5, photoresist layer pattern 140 (shown in FIG. 4), which may be used to form trenches 102, may be removed. An oxidation process may then be carried out on a surface (for example, the entire surface), such that polyoxide layer 151 may be formed on polysilicon layer pattern 122. At the same time, sidewall oxide layer 152 may be formed in trench 102. Prior to the oxidation process, an ion implanting process may be carried out. A nitride layer may then be formed, such that spacer nitride layer 161 as a gate spacer layer may be formed on polyoxide layer 151. At the same time, liner nitride layer 162 may be formed on sidewall oxide layer 152 in trench 102.

Figure 6:
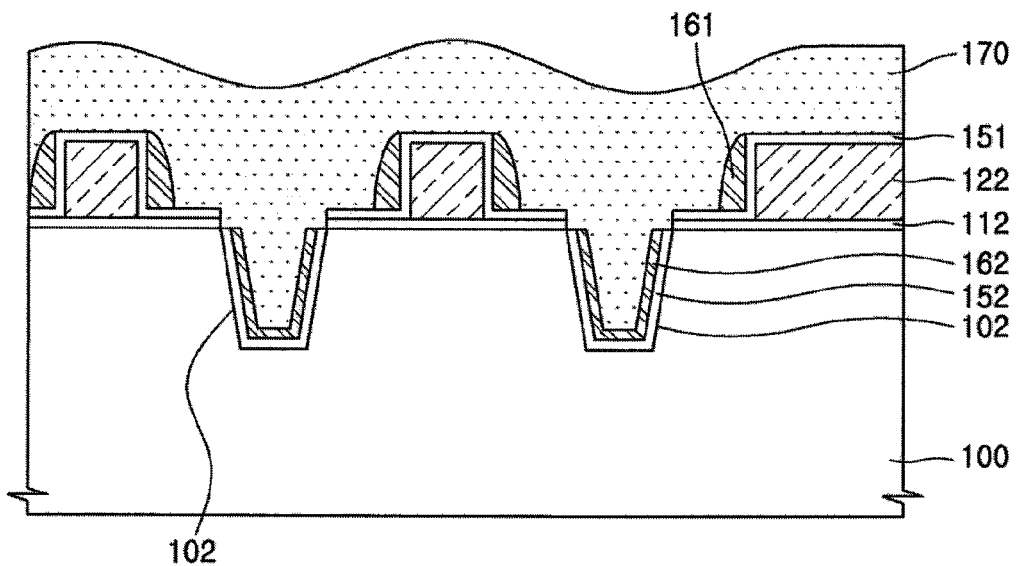

Referring to FIG. 6, dielectric layer 170 may be formed on a surface (for example, the entire surface), and may fill trench 102. Dielectric layer 170 may function as an interlayer dielectric layer and may serve as a filling dielectric layer for constructing a trench isolation layer. Such a process of forming the trench isolation layer may not need separate steps for the formation of the side wall oxide layer and the liner nitride layer, and may not produce a polysilicon residue because polysilicon layer pattern 122 may be formed prior to trench 102.

After that, although not shown in the drawings, an interconnection may be formed by a related art metallic interconnecting process, after forming a contact hole penetrating through dielectric layer 170.

According to embodiments, process steps and a time required may be reduced by forming the side wall oxide layer and the liner nitride layer in the trench at the same time when the polysilicon oxide layer and the spacer nitride layer may be formed. A polysilicon residue may also not produced after the completion of the trench isolation layer because the trench for isolating components may be formed after a gate patterning is carried out.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
    forming a gate conductive layer pattern over an active region of a semiconductor substrate defined by an isolation region;
    forming an isolation trench by etching the isolation region of the semiconductor substrate;
    forming a polyoxide layer over the gate conductive layer pattern and a sidewall oxide layer over a sidewall in the trench by performing an oxidation process; and
    forming a spacer nitride layer over the polyoxide layer and a liner nitride layer over the sidewall oxide layer by performing a nitride layer forming process,
    wherein the polyoxide layer and the sidewall oxide layer are formed in a single oxidation process and the spacer nitride layer and the liner nitride layer are formed in a single nitride layer forming process.

2. The method of claim 1, further comprising forming a dielectric layer over an entire surface of the resultant structure to fill the trench.

3. The method of claim 1, wherein a gate dielectric layer is provided over the entire semiconductor substrate prior to forming the isolation trench.

4. The method of claim 1, wherein forming the gate conductive layer pattern comprises:
    sequentially depositing a gate dielectric layer and a gate conductive layer over the semiconductor substrate;
    forming a photoresist layer pattern over the gate conductive layer;
    removing an exposed portion of the gate conductive layer by an etching process using the photoresist layer pattern as an etching mask, thereby forming the gate conductive layer pattern; and
    removing the photoresist layer pattern.

5. The method of claim 4, wherein the gate conductive layer pattern comprises at least one gate electrode.

6. The method of claim 1, wherein forming the isolation trench comprises:
    forming a photoresist layer pattern to expose the isolation region of the semiconductor substrate while not exposing the conductive layer pattern;
    etching the isolation region of the semiconductor substrate to a prescribed depth by an etching process using the photoresist layer pattern as an etching mask; and
    removing the photoresist layer pattern.

7. The method of claim 6, wherein the exposed isolation region of the semiconductor substrate comprises a gate dielectric layer formed over the semiconductor substrate, and wherein the exposed portion of the gate dielectric layer and the semiconductor substrate are etched using the photoresist layer pattern as an etching mask.

8. The method of claim 1, wherein the gate conductive layer pattern comprises a polysilicon layer.

9. A method comprising:
    forming a gate conductive layer pattern over an active region of a semiconductor substrate defined by an isolation region;
    forming an isolation trench in the isolation region after forming the gate conductive layer pattern;
    simultaneously forming a polyoxide layer over the gate conductive layer pattern and a sidewall oxide layer in the trench by performing a single oxidation process after forming the isolation trench and the gate conductive layer pattern; and
    simultaneously forming a spacer nitride layer over the polyoxide layer and a liner nitride layer over the oxide layer by performing a single nitride layer forming process.

10. The method of claim 9, wherein the gate conductive layer pattern comprises a polysilicon layer.

11. The method of claim 10, further comprising, after forming the isolation trench and before simultaneously forming the polyoxide layer over the gate conductive layer pattern and the sidewall oxide layer in the trench:
    forming a dielectric layer over an entire surface of the resultant structure to fill the trench.

12. The method of claim 9, wherein forming the isolation trench comprises:
    forming a photoresist layer pattern to expose the isolation region of the semiconductor substrate while not exposing the conductive layer pattern;
    etching the isolation region of the semiconductor substrate to a prescribed depth by an etching process using the photoresist layer pattern as an etching mask; and then
    removing the photoresist layer pattern.

13. The method of claim 9, wherein forming the gate conductive layer pattern comprises:
    sequentially depositing a gate dielectric layer and a gate conductive layer over the semiconductor substrate;
    forming a photoresist layer pattern over the gate conductive layer;
    removing an exposed portion of the gate conductive layer by an etching process using the photoresist layer pattern as an etching mask, thereby forming the gate conductive layer pattern; and then
    removing the photoresist layer pattern.

* * * * *